(12) United States Patent
Redman-White

(10) Patent No.: US 10,171,131 B2
(45) Date of Patent: Jan. 1, 2019

(54) ELECTRONIC TUNING SYSTEM

(71) Applicant: William Redman-White, Alton (GB)

(72) Inventor: William Redman-White, Alton (GB)

(73) Assignee: William Redman-White, Alton (GB)

( * ) Notice: Subject to any disclaimer, the term of this patent is extended or adjusted under 35 U.S.C. 154(b) by 0 days.

(21) Appl. No.: 15/328,398

(22) PCT Filed: Oct. 16, 2015

(86) PCT No.: PCT/GB2015/000288
§ 371 (c)(1),
(2) Date: Jan. 23, 2017

(87) PCT Pub. No.: WO2016/062992
PCT Pub. Date: Apr. 28, 2016

(65) Prior Publication Data
US 2017/0214433 A1    Jul. 27, 2017

(30) Foreign Application Priority Data
Oct. 24, 2014   (GB) .................................. 1418940.1

(51) Int. Cl.
| | |
|---|---|
| *H04B 5/00* | (2006.01) |
| *H03J 5/24* | (2006.01) |
| *G06K 7/10* | (2006.01) |
| *H02J 50/12* | (2016.01) |
| *H02J 7/02* | (2016.01) |

(52) U.S. Cl.
CPC ....... *H04B 5/0062* (2013.01); *G06K 7/10148* (2013.01); *H02J 50/12* (2016.02); *H03J 5/24* (2013.01); *H04B 5/0025* (2013.01); *H04B 5/0031* (2013.01); *H04B 5/0037* (2013.01); *H04B 5/0056* (2013.01); *H02J 7/025* (2013.01); *H03J 2200/10* (2013.01)

(58) Field of Classification Search
CPC .. H04B 5/0025; H04B 5/0062; H04B 5/0031; H04B 5/0037; H04B 5/0056; H03J 5/24; H03J 2200/10; H02J 7/025; H02J 50/12; G06K 7/10148
See application file for complete search history.

(56) References Cited

U.S. PATENT DOCUMENTS 7,190,153 B2 *  3/2007  Stover ................. A61N 1/378
                                              323/282

* cited by examiner

*Primary Examiner* — Raymond Dean

(57) ABSTRACT

A system is provided that can automatically adjust a tuned circuit to resonate at the frequency of an applied excitation signal. The error in the resonant frequency of the tuned circuit is determined in real time from signals derived from within the network. The system permits the use of a time varying excitation frequency in a high Q circuit, including modulation conveying information. The tuning information may be stored in a memory and used to set the tuning instantaneously in order to maintain resonance when the excitation frequency changes abruptly, for example when frequency shift keying is used.

19 Claims, 18 Drawing Sheets

ELECTRONIC TUNING SYSTEM

In inductively coupled systems such as radio frequency identification (RFID), implanted biomedical devices or wireless charging it is desirable to have a transmitter or reader function that generates a strong magnetic field with a minimum power for the transmitter circuitry. As a result, it is desirable to use an antenna inductor in a resonant circuit with a high quality factor (Q), since a high Q gives a high circulating current with a lower drive voltage. However, this limits the bandwidth usable for any data communication, and makes the system very sensitive to tuning errors due to component manufacturing tolerances and post manufacture parametric drift from environmental factors and ageing. These problems apply similarly to other systems and diverse applications employing inductive-capacitive resonant circuits.

Hence it is desired to be able to compensate automatically for manufacturing tolerances and component parameter drift. Techniques for switching into the circuit a range of small, possibly binary weighted, capacitors to effect tuning are well known, but these require many discrete components and the need for many pins on an integrated circuit implementation will increase cost and package size. In U.S. Pat. No. 7,190,153 Stover and Mann describe a system which partially addresses these requirements by switching a capacitor in and out of an inductor-capacitor (LC) circuit with a defined duty cycle that effects continuous tuning, but this has limitations insofar as with the various methods they propose for the timing of the switch there is no mechanism to minimise losses and transients in the switching operation. More significantly, their proposed switch timing and the means they propose to sense that the circuit is at resonance and how the control system is placed in the circuit are not the most beneficial for controlling the resonant behaviour and do not provide for a fast response in the control to changes in the excitation frequency.

An additional requirement is that any data modulation scheme should not reduce the power delivered to the target device, as is the case presently where amplitude shift keying (ASK) is used. In order to deliver more power to the target device it would be advantageous to use a frequency modulation scheme. While the target device receiver is likely to have a low Q antenna with sufficiently wide bandwidth (BW) to avoid problems with component tolerances and environmental drift, the use of a high Q transmit antenna would seriously restrict such a modulation method.

According to a first aspect there is provided a circuit according to claim 1.

It is an aim of some embodiments to provide means for maintaining an inductive-capacitive (LC) network at resonance taking into account component parameter errors due environmental and ageing as well as manufacturing tolerances. Such means should be automatic and require minimal external input for satisfactory operation. The described embodiments are applicable to LC resonant circuits in a wide range of applications, but are of particular value in inductively coupled systems such as RFID or wireless charging.

The described embodiments permit the use of a high Q factor in a resonant circuit for a defined excitation frequency without concerns over component parametric drift due to environmental factors or manufacturing tolerances.

A further benefit of the embodiments is that since resonance can be maintained allowing for changes in the excitation frequency, then if the automatic tuning is made to have a fast response, it is possible to use a frequency modulated (FM) excitation with a deviation much wider than the inherent bandwidth of the resonant circuit.

A further feature of the embodiments is to employ a self tuning system to determine the relationship between any tuning input and the excitation frequency and store this relationship in a memory of some type. Using these stored data, the resonant frequency of an LC circuit may be set to match the instantaneous frequency of any excitation, thereby allowing abrupt changes in excitation frequency to be applied and hence permitting the use of frequency shift keying (FSK) as a modulation of the excitation.

The embodiments will now be described solely by way of example and with reference to the accompanying drawings in which:

FIG. 1 shows prior art comprising an inductor and capacitor circuit driven by a square wave excitation with an additional capacitor periodically switched into the circuit to vary the apparent resonant frequency according to U.S. Pat. No. 7,190,153.

Figure 4:
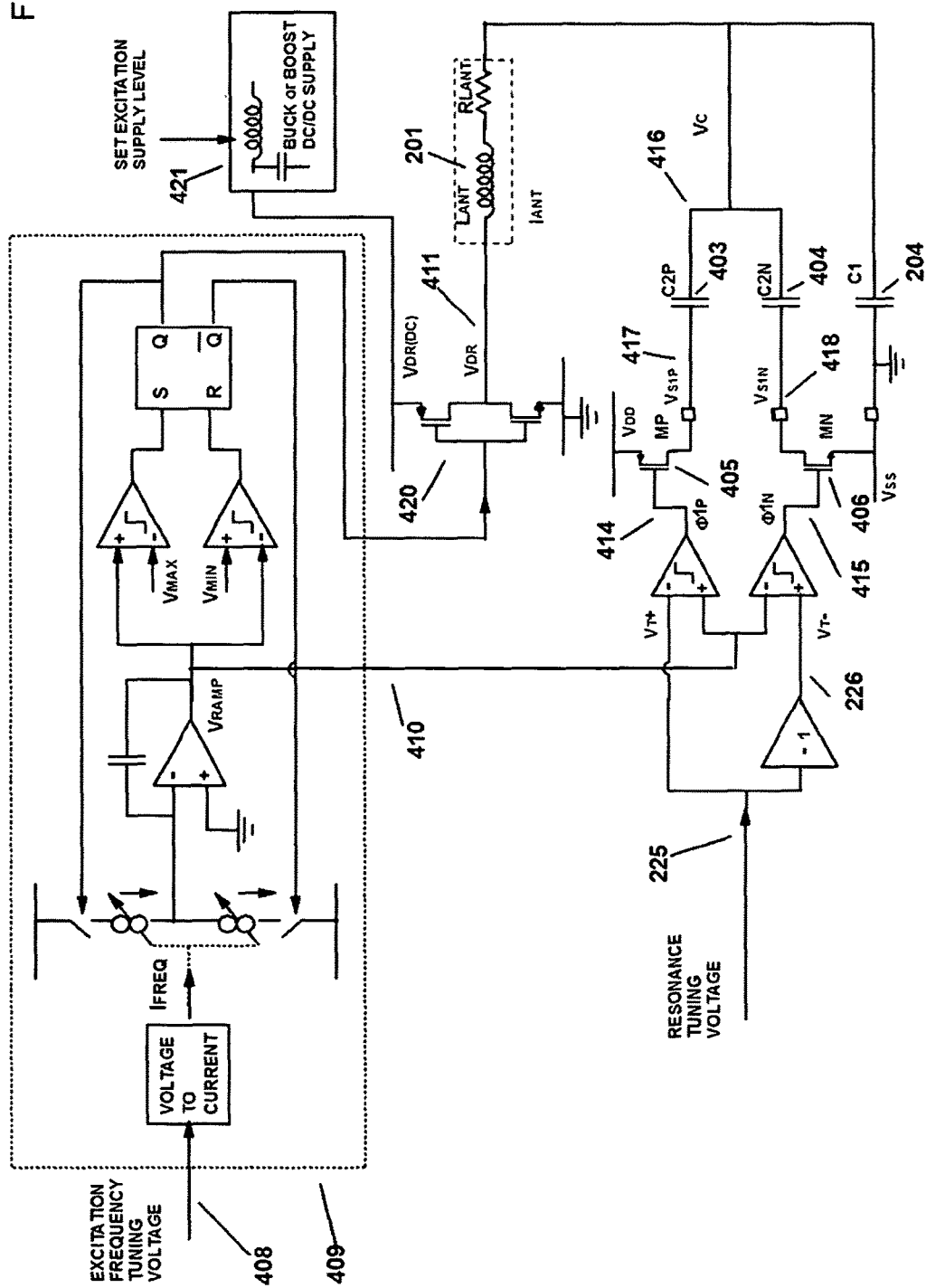

FIG. 4 shows a means for generating an excitation frequency signal and square wave drive for the inductor capacitor and switched capacitor network and for switching capacitors in and out of the LC tuned circuit at instants either side of the instant of peak of the capacitor voltage at resonance in order to vary the apparent resonant frequency using complementary field effect transistor (FET) switches in a manner suitable for integrated circuit implementation according to an embodiment of the present invention.

Figure 5:
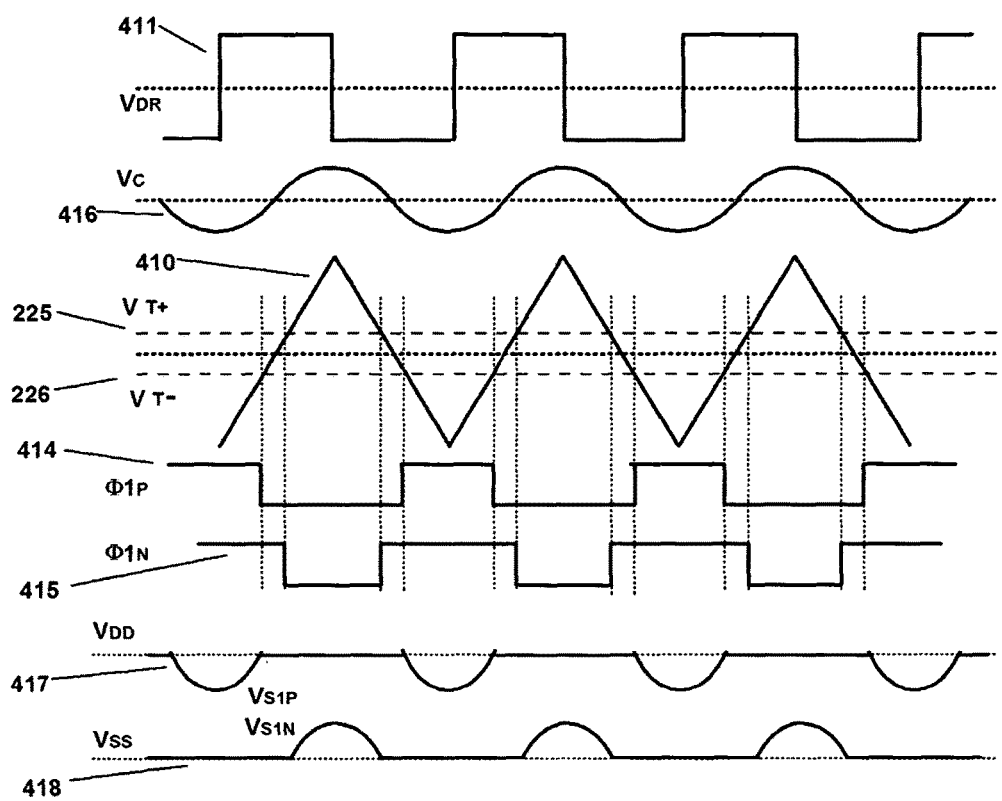

FIG. 5 shows the apparent voltages present in the system shown in FIG. 4 when the excitation is close to resonance.

Figure 6:
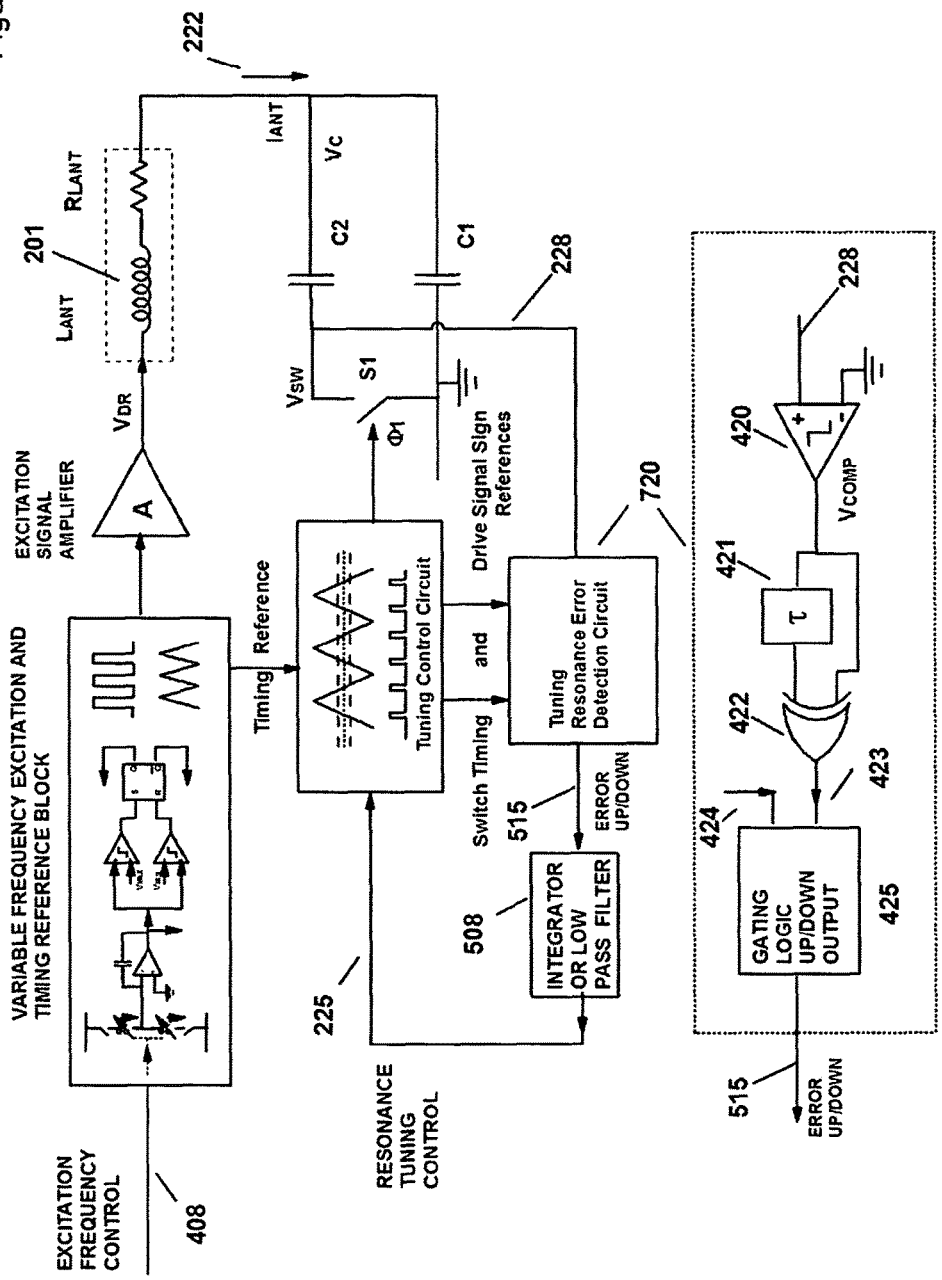

FIG. 6 shows a means for generating an excitation frequency signal and square wave drive for the inductor capacitor and switched capacitor network and for switching capacitors in and out of circuit and for determining any error in the timing of said switches and feeding back a signal so as automatically to maintain the network at resonance according to an embodiment of the present invention.

Figure 7:
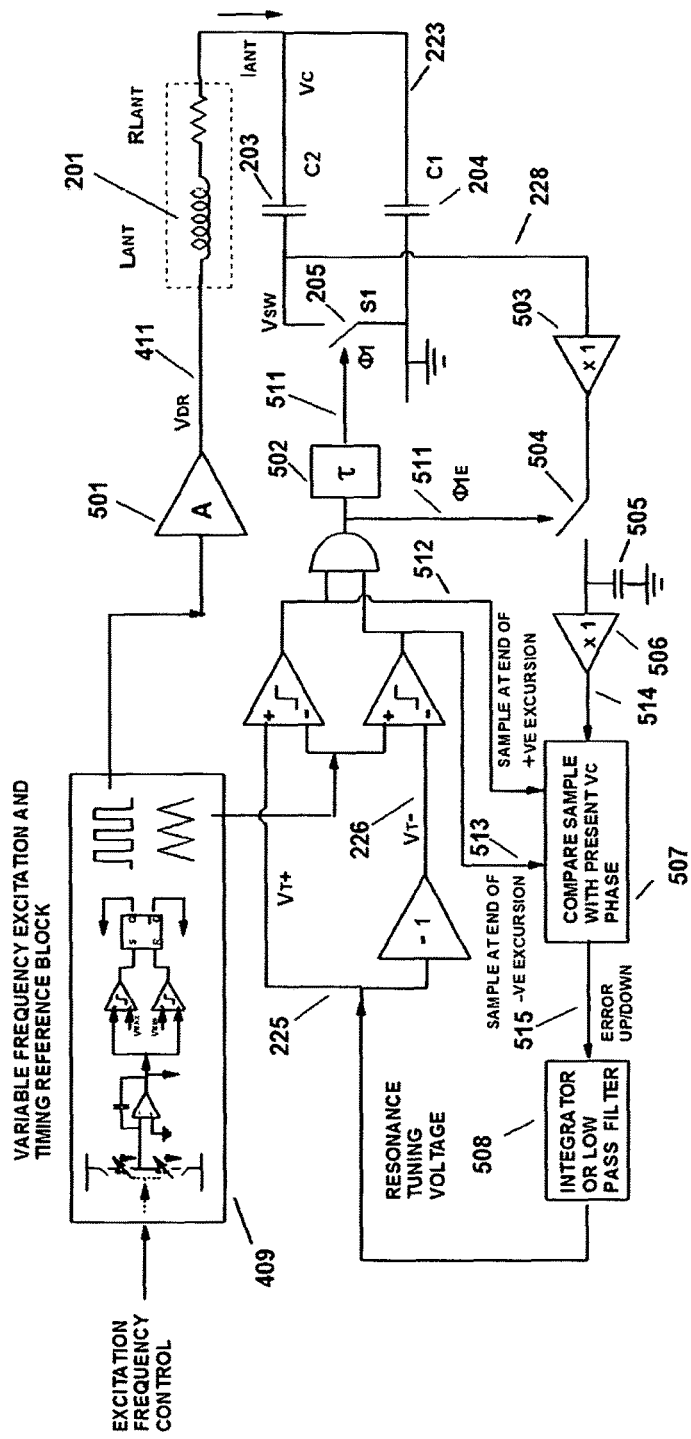
Figure 8:
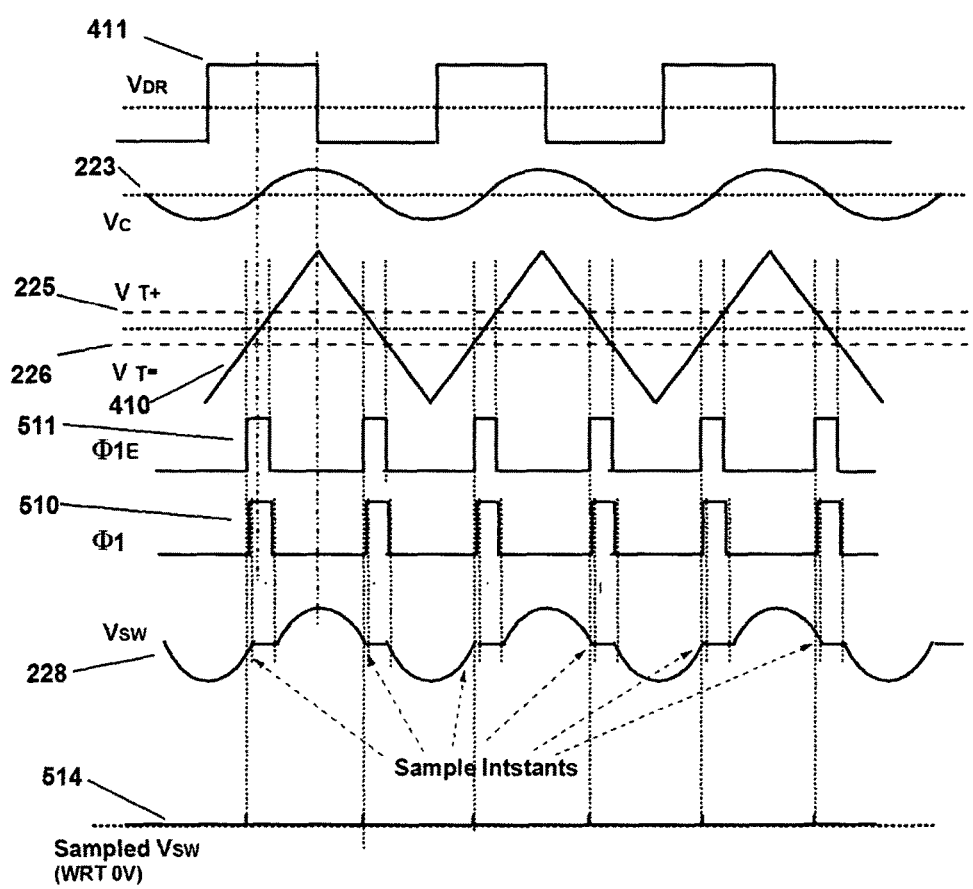

FIG. 7 shows a further means for generating an excitation frequency signal and square wave drive for the inductor capacitor and switched capacitor network and for switching capacitors in and out of circuit and for determining any error in the timing of said switches and feeding back a signal so as automatically to maintain the network at resonance according to an embodiment of the present invention FIG. 8 shows the voltages apparent in the circuit of FIG. 7 when the system is resonating at the excitation frequency.

Figure 9:
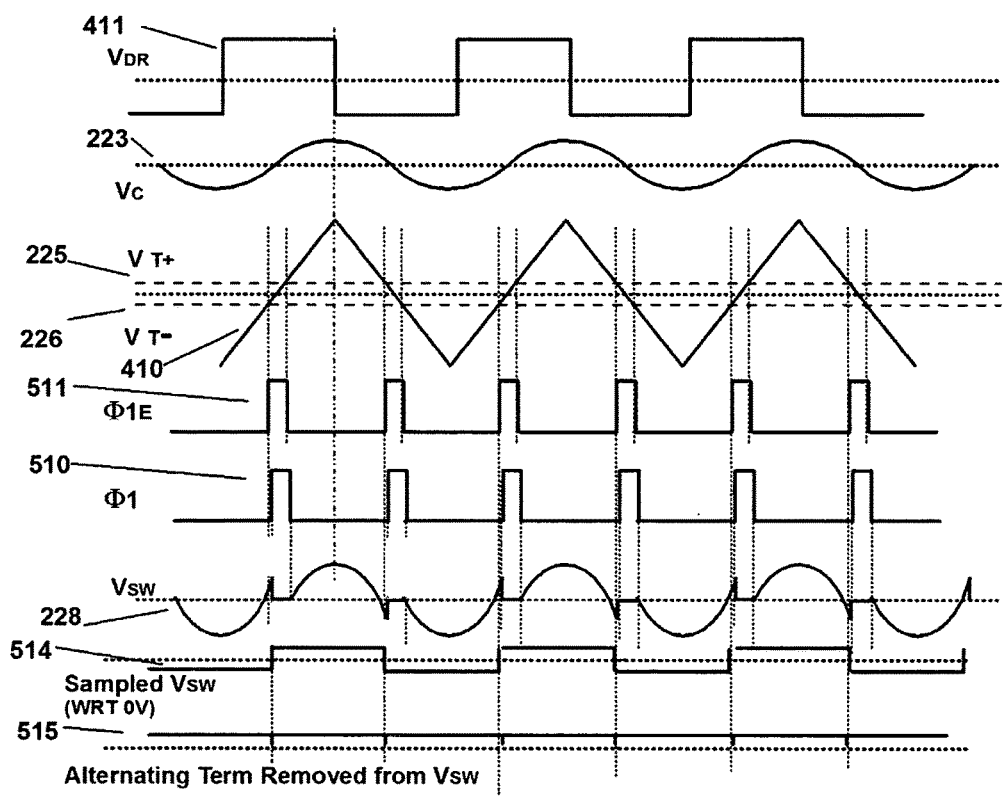

FIG. 9 shows the voltages apparent in the circuit of FIG. 7 when the tuning voltage sets the timing for a resonant frequency above the applied excitation frequency and the error signals derived from this condition.

Figure 10:
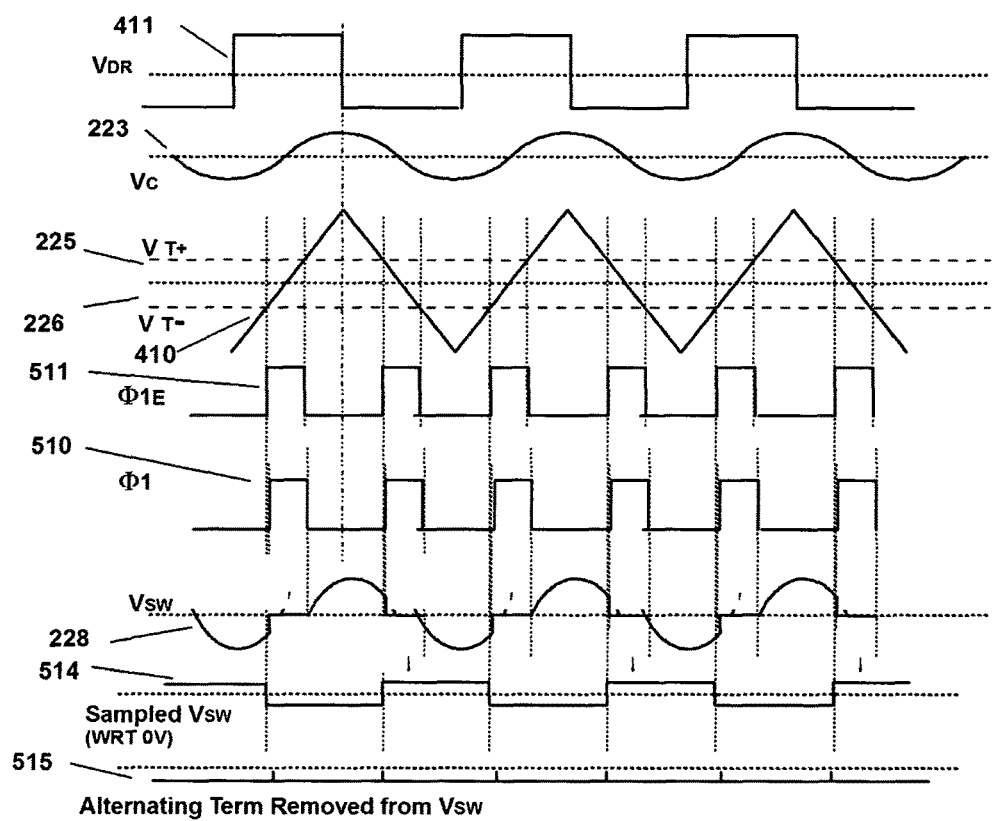

FIG. 10 shows the voltages apparent in the circuit of FIG. 7 when the tuning voltage sets the timing for a resonant frequency below the applied excitation frequency and the error signals derived from this condition.

Figure 11:
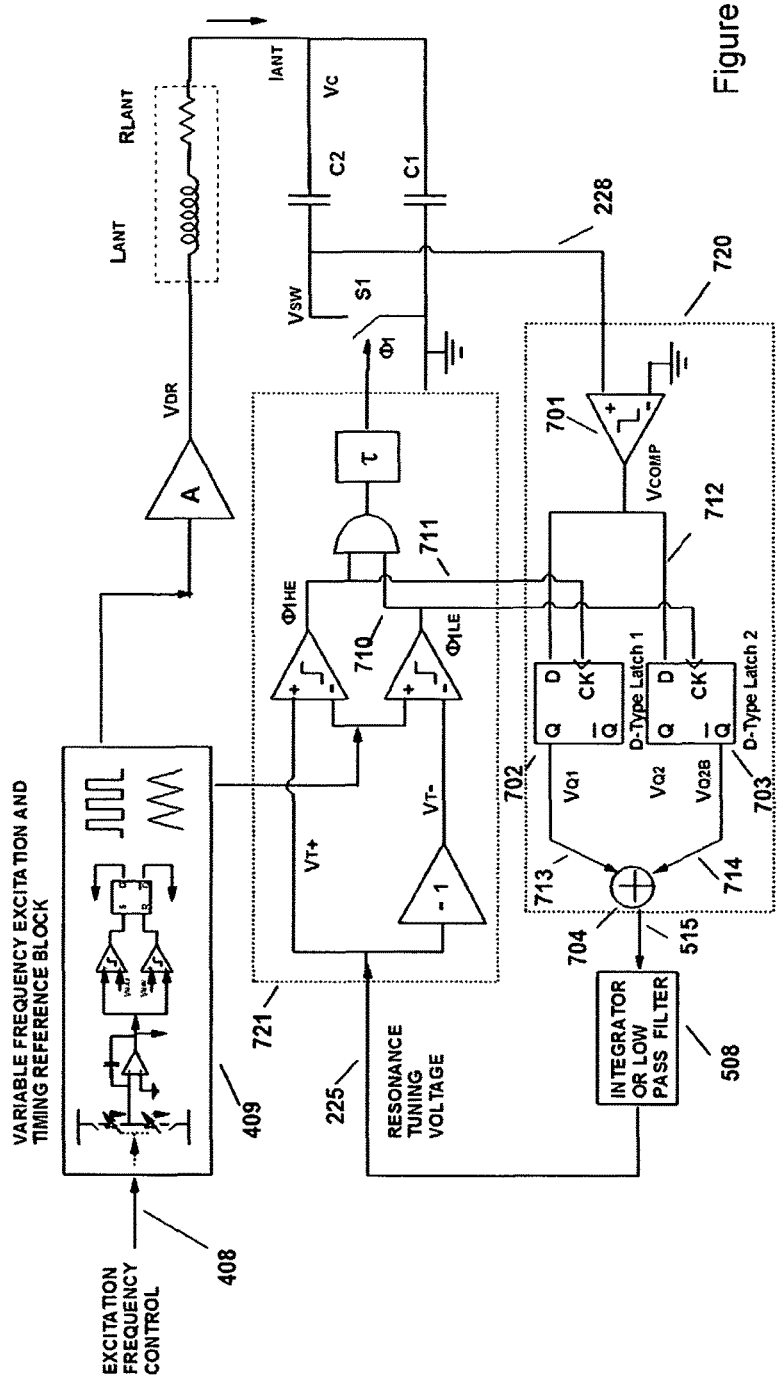

FIG. 11 shows a means for driving an inductor capacitor and switched capacitor network having variable apparent resonant frequency and the timing signals for the associated switches and for further deriving error signals resulting from the apparent resonant frequency being above or below the excitation and providing means to correct the tuning by means of the switch timing such that the system remains at resonance even if the excitation frequency changes or electronic component parameters change according to an embodiment of the present invention.

Figure 12:
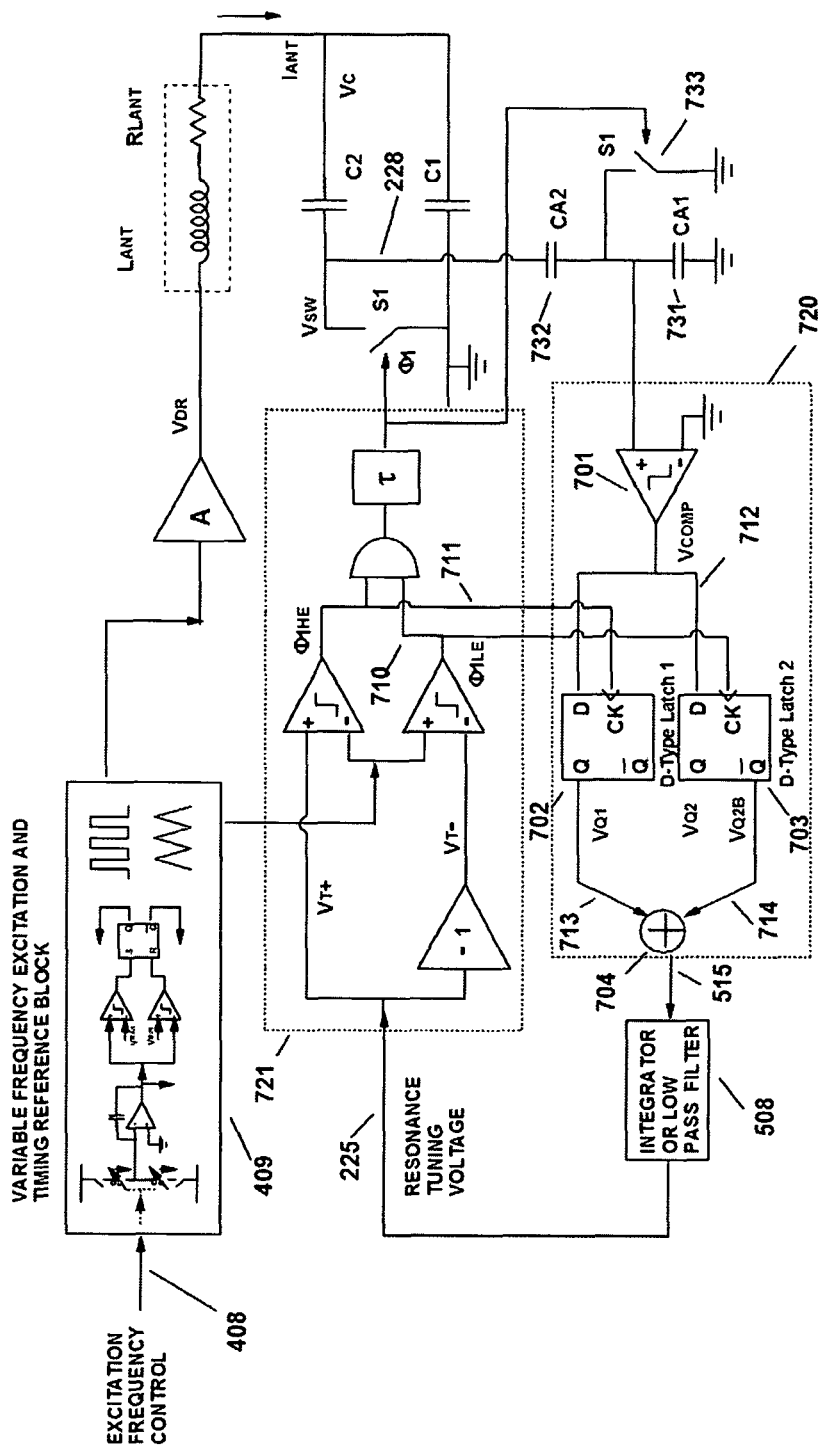

FIG. 12 shows a means for reducing the voltage seen by the sensing means for the error signals.

Figure 13:
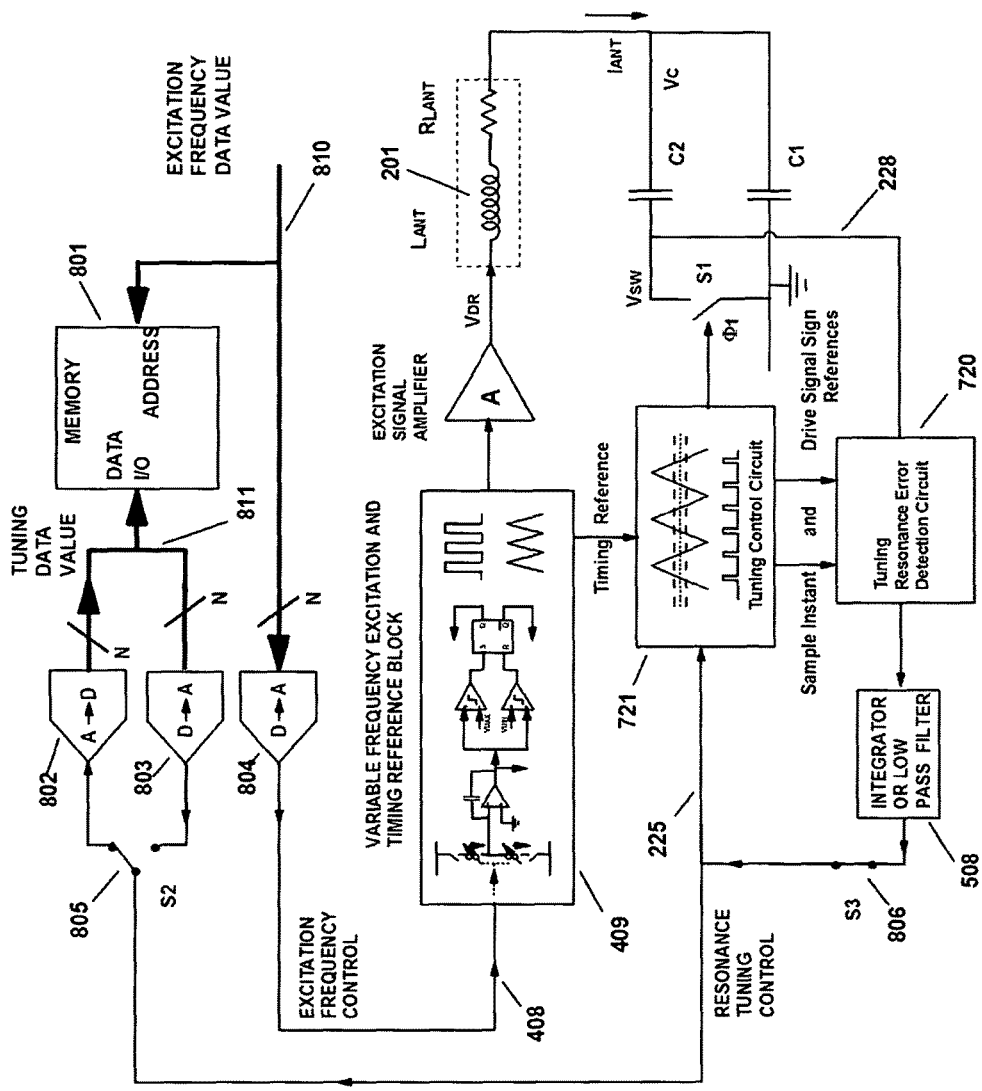

FIG. 13 shows a means for determining the relationship between the frequency of an excitation applied to a tuneable inductor-capacitor and switched capacitor network and the timing of the switches required to achieve resonance at any frequency within the system's capability to resonate and to store data relating to this relationship in a memory according to an embodiment of the present invention.

Figure 14:
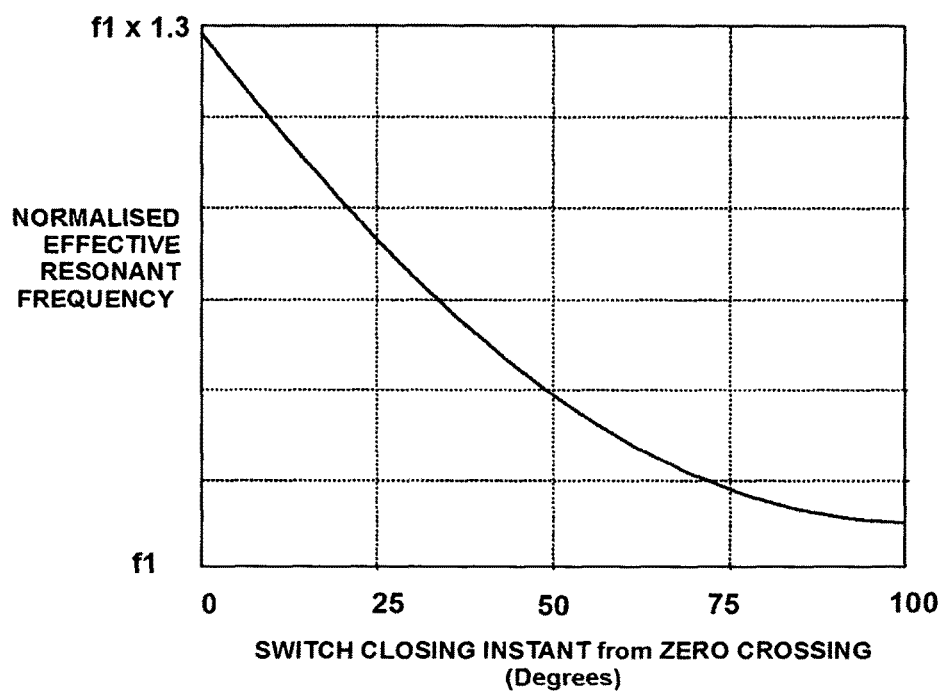

FIG. 14 shows by way of example a typical relationship between the switch timing in terms of the phase of the switch opening and the excitation frequency in an inductor capacitor and switched capacitor network.

Figure 15:
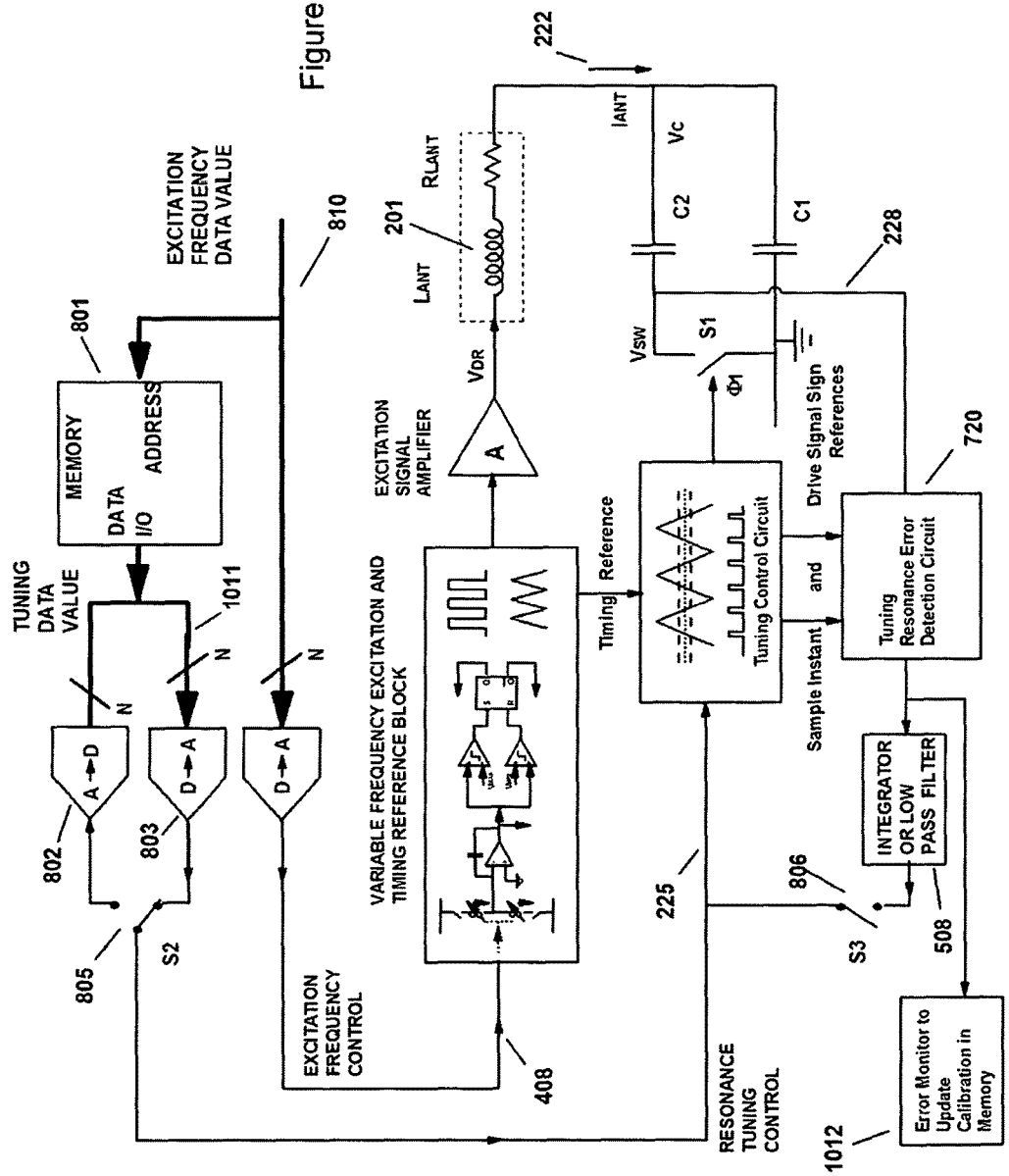

FIG. 15 shows a means for applying an excitation signal to a tuneable inductor capacitor and switched capacitor network and for maintaining the network at resonance while the excitation frequency may vary rapidly or instantaneously by means of altering the switch timing according to stored data relating the excitation frequency to the switch timing required to maintain resonance according to an embodiment of the present invention.

Figure 16:
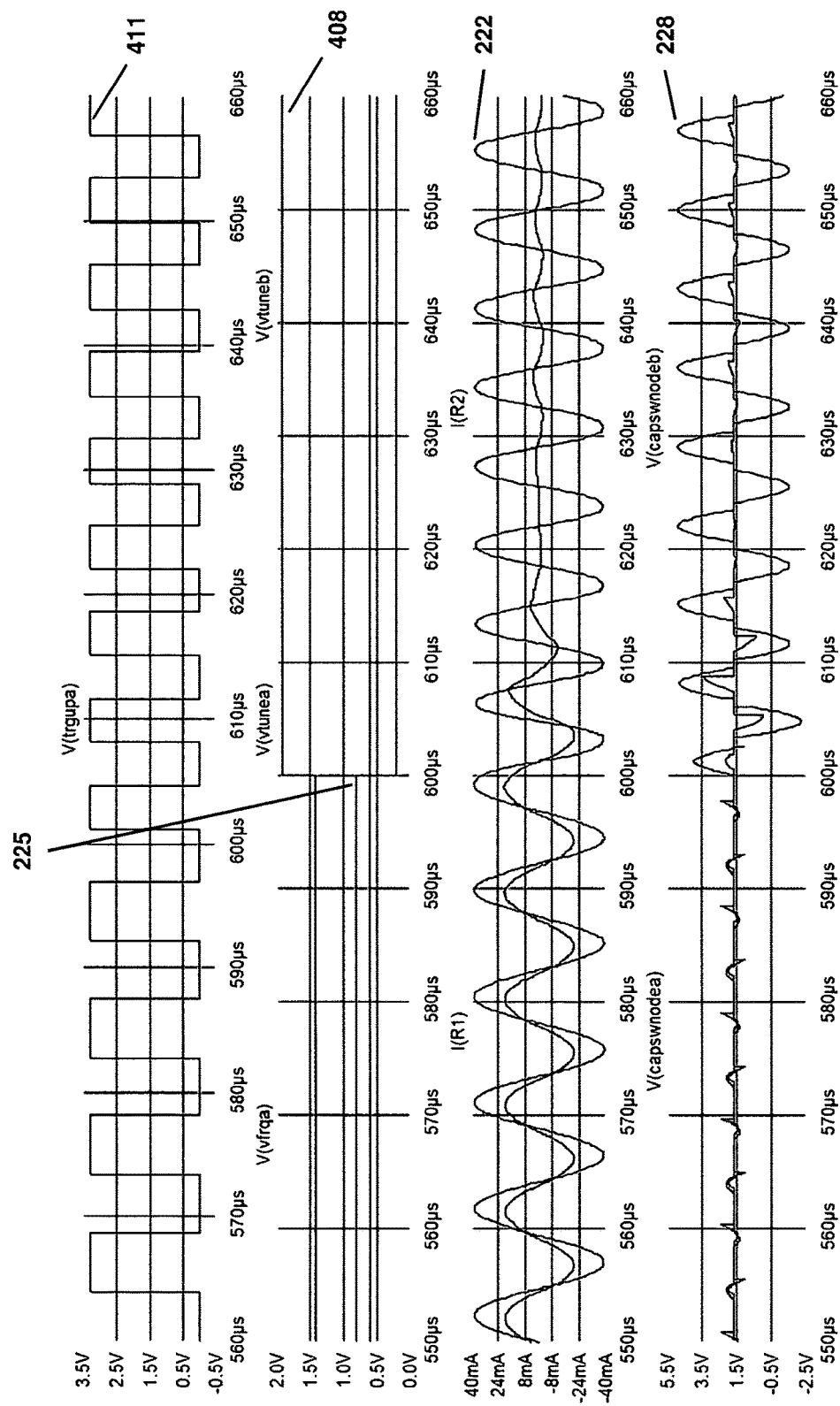

FIG. 16 shows waveforms apparent in an inductor capacitor and switched capacitor network where a stored characteristic is used to change the switch timing to match an abrupt change in excitation frequency showing how resonance is maintained while the waveform for the current in a circuit with fixed tuning is shown for comparison.

Figure 17:
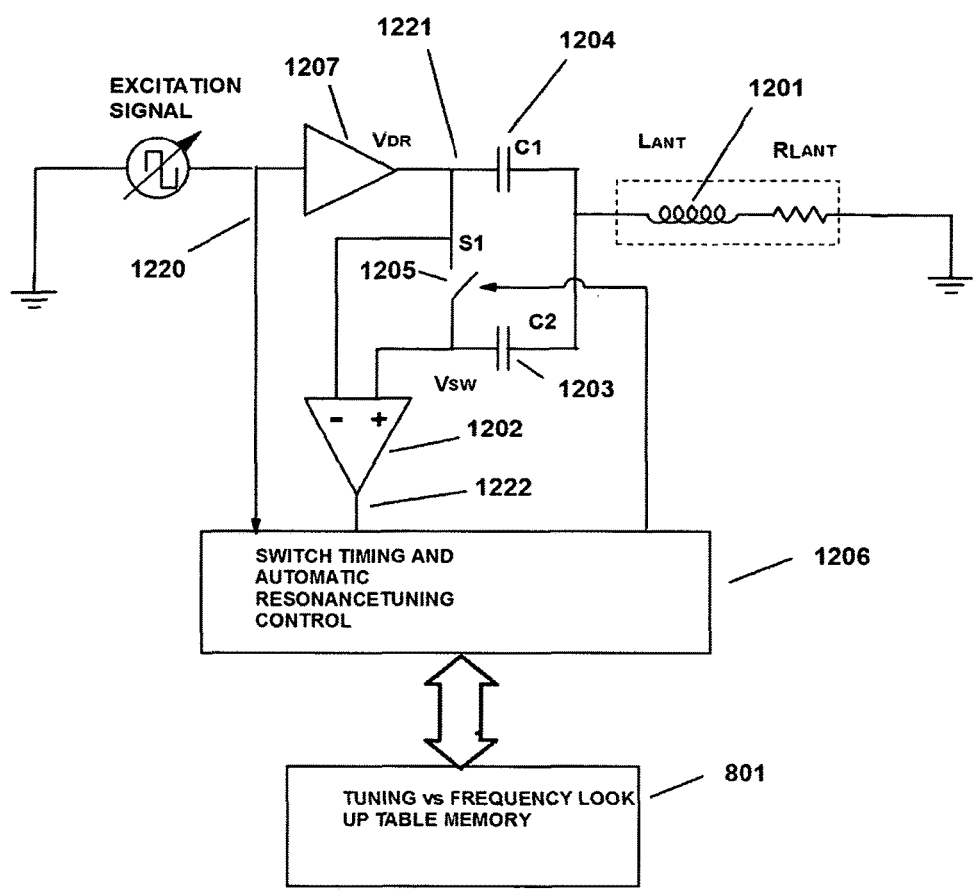

FIG. 17 shows an arrangement of the automatic tuning system wherein the fixed and switched capacitors are connected to the excitation and the inductor is connected to ground.

Figure 18:
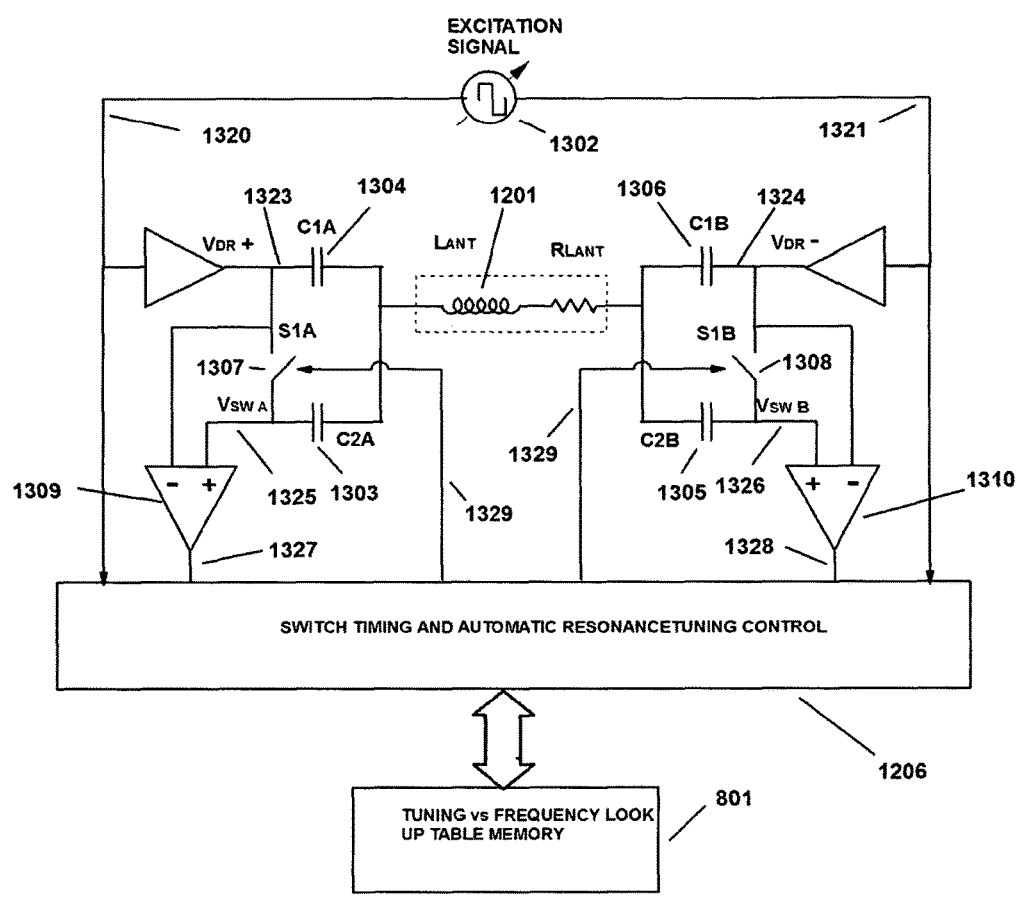

FIG. 18 shows an arrangement of the automatic tuning system wherein the excitation is applied differentially.

The description is not to be taken in a limiting sense but is made merely for the purposes of describing the general principles of the embodiments of the invention.

Figure 1:
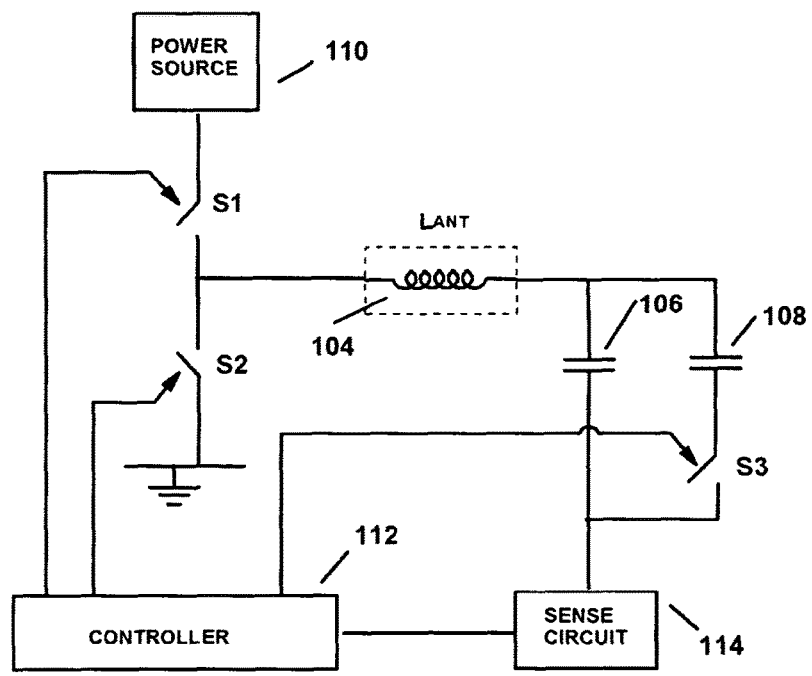

FIG. 1 shows prior art comprising an inductor 104 and capacitor 106 forming a series resonant circuit driven by a square wave excitation with an additional capacitor 108 periodically switched into the circuit by a control circuit 112 with a defined duty cycle in order to vary the apparent resonant frequency according to U.S. Pat. No. 7,190,153. Note that the precise waveform of the excitation is not of great importance, since the circuit will filter the harmonic components and leave a substantially sinusoidal current flowing in the inductor. In a practical system the waveform is likely to be either sinusoidal or square. When only one capacitor is in circuit the resonant frequency has a first value, say f1, and when both capacitors are in circuit, the resonant frequency is lowered to a second value, say f2. The apparent resonant frequency can be adjusted by changing the proportion of each excitation cycle in each switch state. By setting f1 and f2 to be above and below the desired operating frequency of the system, it becomes possible to tune the system to resonance taking into account any variations in electronic component values due to manufacturing tolerances or due to environmental factors.

In the prior art the precise timing of the switches is left open to choice with one preferred method described, but it is clear that this simple switch timing strategy is not optimal since in FIG. 6 of U.S. Pat. No. 7,190,153 the inventors provide for an additional capacitor across the switch to reduce transients caused by the switching process. A high Q factor is desirable in order to maximise the inductor current for a given excitation voltage supply, since in a system for transferring power by inductive coupling, the larger magnetic field resulting will increase both the maximum physical distance and the power transferred to the load. From the definition of Q it follows that energy losses during each cycle must be minimised. Allowing large transients to occur at the switches is clearly not preferable in pursuit of low energy lost per cycle. It is also clear that the proposal for placing the means for determining the state of resonance (114 in FIG. 1) is not optimal.

It is an aim of some embodiments of the present invention to be able to control the state of resonance automatically and to meet this objective the timing of the switch or switches used is restricted and defined such that at resonance the opening and closing of the switch or switches is symmetrically disposed in time about the peak of the capacitor voltage. The description of the embodiments is therefore introduced by first describing means to control the switching of capacitance in a tuned circuit in ways that enable automatic tuning to be applied to maintain resonance at an applied excitation frequency, and then further to use this facility to allow frequency modulation of the excitation.

Figure 2:
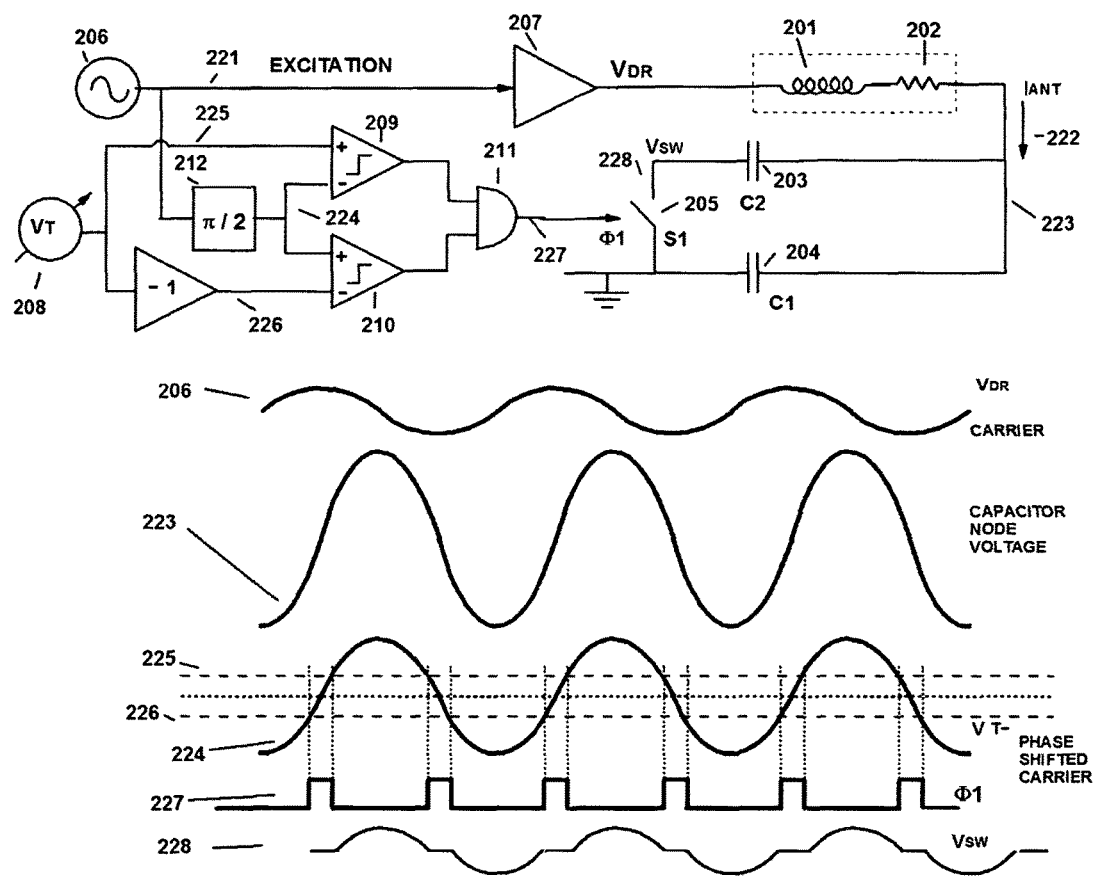
FIG. 2 shows an inductor and capacitor circuit driven by an excitation signal with means to switch an additional capacitor in and out of circuit symmetrically about the peak of the capacitor voltage according to an embodiment of the present invention together with examples of the apparent voltages inside the circuit when at resonance.

FIG. 2 shows a schematic diagram of a circuit wherein the resonant frequency may be varied by switching a capacitor in and out of circuit according to an embodiment of the invention, as well as examples of the signal waveforms apparent in the circuit when at resonance. A sinusoidal signal source 206 is used for illustrative purposes but the operation is essentially the same with a square wave source. An excitation signal 221 is amplified and drives the inductor 201 and the main capacitor 203 and the switched capacitor 204 forming a series resonant circuit. At resonance the voltage 223 across the main capacitor 204 will be 90° out of phase with the excitation signal 221 and will have a substantially sinusoidal waveform due to the filtering action of the circuit. It is desired to open and close the switch 205 at instants that are symmetrical in time about the peak of the waveform 223 when the circuit is at resonance. Sensing the capacitor voltage itself is only valid when resonance is achieved and under other conditions the phase relationships change. Hence to provide an accurate and reliable timing reference for the opening and closing of the switch 205, a version of the excitation signal is created with 90° phase shift 224 by means of an integrator 212. In the case of a sinusoidal excitation this will also be sinusoidal, and in the case of a square wave excitation the integrated signal will be a triangle waveform. For the purposes of explanation it is assumed that the mean value of the phase shifted signal 224 is set to zero, although this is not essential. As an example of a tuning means, a DC voltage input signal 225 is used as the control variable. Taking this voltage 225 and its inverse with respect to zero 226 and comparing these with the phase shifted signal 224 and using a simple logic function 211 it is possible to create a control 227 for the switch 205 that will open and close the switch symmetrically around the capacitor voltage peak when at resonance.

Figure 3:
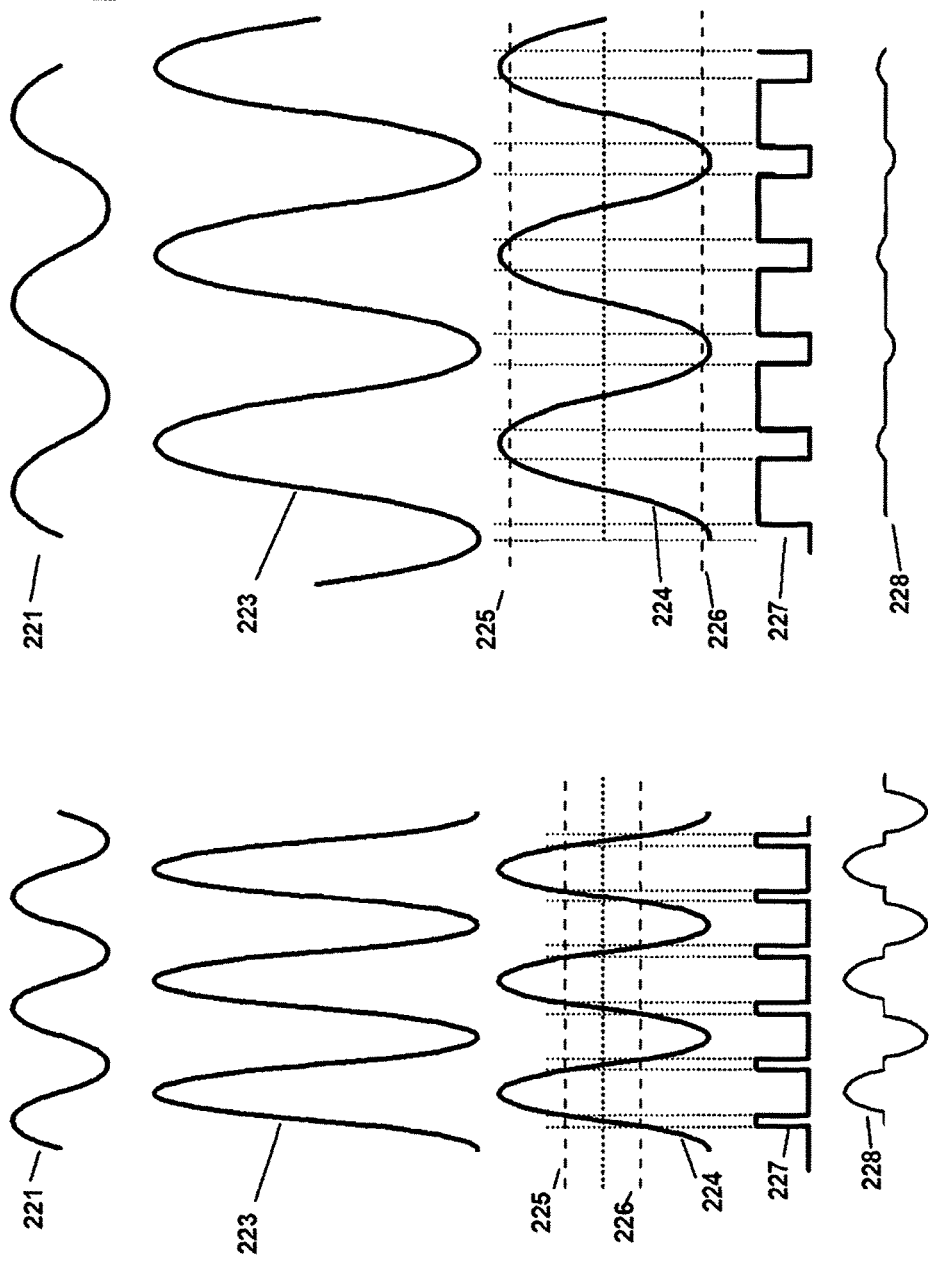
FIG. 3 shows the voltages apparent in the circuit in FIG. 2 when the excitation is close to the maximum resonant frequency and when the excitation is close to the minimum resonant frequency.

The voltage waveform 228 seen across the switch 205 shows that at resonance the voltage across the switch returns to a zero level at the instant the switch closes, and thus there are no transients generated and unwanted high voltage spikes to be absorbed and thus losses in the switching process are also minimised. FIG. 3 shows the waveforms in the circuit in FIG. 2 when the excitation frequency is close the either the maximum operating frequency f1 and to the minimum f2. To maintain resonance close to f1 the tuning control signal 225 is set to a high level and as a result of the comparison with the phase shifted signal 224, the switch control signal 227 is only high for a short time closing the switch 205 for only a small part of the excitation cycle. When the excitation frequency is close the minimum operating frequency f2, to maintain resonance the tuning control signal 225 is set to a low level and as a result of the comparison with the phase shifted signal 224, the switch control signal 227 is high for the majority of the time closing the switch 205 for most of the excitation cycle.

The foregoing description is provided as an example of means to provide the appropriate signals. It will be obvious to one skilled in the arts that there are many means for providing the excitation and for deriving switching timing signals that are referred to a time reference phase shifted by 90° with respect to the excitation and for implementing the switch functions. These may be substantially analogue or substantially digital or a combination of these methods.

FIG. 4 shows some embodiments that are advantageous when fabricated in an integrated circuit where there are restrictions on the implementation of the switch functions. FIG. 5 shows examples of the waveforms apparent in the circuit in FIG. 4 when the excitation is substantially equal to the effective resonance frequency. The excitation frequency is set by means of a DC control signal 408 that controls a voltage controlled oscillator (VCO) 409 of conventional type wherein a variable slope ramp signal is generated and compared with positive and negative reference voltages to reverse the slope such that a square wave output signal is generated as well as a triangle signal 410 which is 90° out of phase. In one possible embodiment a class D driver 420 with a variable supply 421 is used to apply an amplified version of the square excitation signal 411 to the inductor 210. Because of the restrictions on the implementation of integrated switches that can withstand potentially large capacitor voltages, and where to avoid breakdown it is also important to avoid voltage excursions at the pins that are significantly above and below the power supplies of the integrated circuit, the switching can be advantageously performed by complementary P and N channel FETs 405 and 406. Obviously, other types of electronic devices may also be used to perform the switching function. In this case the switched capacitor 203 is split into two equal parts 403 and 404 and each connected to one of the FET switches 405 and 406 respectively. To respect the voltage limitations of the FET switches, it is preferable that the P FET switch only opens when the voltage on the fixed capacitor 204 is becoming more negative and hence the opening period is limited to a maximum of half the excitation period. A similar restriction applies to the N FET. Since one of the two switched capacitors will always be connected, it is not essential that the fixed capacitor is retained in the circuit and for the largest frequency range the capacitor 204 may be omitted. A further reduction in the maximum voltage stress experienced by the switches may be achieved by adding another capacitor in series with capacitors 417 and 418 to form a capacitive potential divider albeit at the expense of reduced tuning range.

Two control signals are now required for the switching functions and these may be conveniently derived by combining the DC tuning signal 225 and its inverse 226 with the triangle signal 410 from the voltage controlled oscillator 409 to generate control signal 414 for the gate of the P FET 405 and control signal 415 for the gate of the N FET 406. At resonance the drain voltages of the FET switches are clamped to the respective power supplies in the ON state. When the P FET is switched OFF, the drain voltage 417 moves negative but returns to give a zero drain-source voltage at the instant of turning ON. A similar but complementary behaviour 418 is seen at the drain of the N FET.

FIG. 2 and FIG. 4 show two possible embodiments for the continuous tuning of a resonant circuit and with this understanding the means for achieving automatic tuning are now explained.

In FIG. 2 and FIG. 3 it will be apparent that the voltage 228 across the switch 205 is zero at the point that the switch opens and is also zero when the switch closes. This is advantageous in minimising energy losses in the tuned circuit. The return of voltage waveform 228 to zero is a consequence of the symmetry of the switch opening and closing instants with respect to the maximum voltage on the capacitor 204 at resonance and this also corresponds with the peak of the phase shifted excitation signal 224. However, if the circuit is not at resonance these conditions are not met. The voltage across the switch 205 must always be zero at the instant that it opens, but if the excitation frequency does not match the apparent resonant frequency set by the switching duty cycle, the voltage across the switch will not be zero at the instant that it closes. The sign of the voltage across the switch 205 immediately before the switch closes may therefore be used advantageously to determine whether the excitation frequency is above or below the effective resonant frequency and so provide information for an automatic control of system intended to tune the circuit to resonance.

Note that the method of sensing the voltage across the switch or switches from within the tuned circuit in order to determine resonance is materially different from the method described in U.S. Pat. No. 7,190,153 wherein the inventors suggest that it is possible to sense the output of the resonant circuit in some way, although no exemplary means are presented therein. The output of the resonant circuit in the context of U.S. Pat. No. 7,190,153 is shown as the node carrying the path for the return current through the tuned circuit.

FIG. 6 shows one embodiment that incorporates automatic tuning of the resonant frequency. Many other embodiments are possible to create and detect the appropriate signals based on the principles to be described using analogue or digital techniques or a combination thereof, and these will be obvious to one skilled in the art. In the example described herein an excitation signal is generated in a VCO 409 under the control of an input DC voltage and the inductor is driven with the resulting signal 411. In this example, the control signal 511 for the switch 205 is derived from the triangle output 410 from the VCO 409. The error in the apparent resonant frequency of the LC circuit comprising inductor 201 and capacitors 403 and 404 with respect to the frequency of the excitation 411 is sensed by detecting if the voltage across the switch 205 or switches 405 and 406 depending on implementation changes sign during the ON or active period of the switch or switches. In the example shown, this condition is detected by passing the output from a comparator 420 which senses the switch voltage with respect to its closed condition through a delay 422 and recombined with itself to give a pulse indicating that a zero crossing has occurred. By gating this output with the switch control signal 424 it is possible to determine if the crossing occurs during the ON period, and from this to create an error signal 515 indicating that the adjustment of the tuning either up or down in frequency. Many other methods for determining a sign change are possible and will be obvious to one skilled in the art. This error signal 515 may then be filtered or integrated to create the tuning signal 225 needed to set the circuit to resonance.

A further means of detecting the tuning error employs sensing the waveform of the voltage across the switch 205 or switches 405 and 406 depending on implementation and determining a prediction of the time instant when the voltage would return to the value when the switch or switches are closed. This predicted time instant may be compared with the actual time when the voltage across the switch or switches returns to zero and the difference between the two time values used to create an error signal 515.

FIG. 7 shows a yet further embodiment that incorporates automatic tuning of the resonant frequency. In this example, the control signal 511 for the switch 205 is derived from the triangle output 410 from the VCO 409 as described previously but a small delay 502 is introduced in the path to the switch control terminal. This delay timing is not critical but should be long enough to permit the sampling of the voltage waveform 228 across the switch 205, but not long enough to significantly affect the 90° phase shift of the switch timing reference. In an extreme practical case where it might be difficult to achieve these timing constraints, some adjustment of the phase shift in the switch timing reference may be included and many ways of implementing such a requirement will be obvious to one skilled in the art. The switch control signal without the added delay is used to control a sampling function represented by a switch 504, a capacitor 505 and a buffer 506 although clearly other arrangements are equally suitable. FIG. 8 shows example waveforms when the system in FIG. 7 is at resonance and the sampled value 514 immediately prior to the switch closing is zero.

The sample 514 taken from the switch waveform 228 is then passed to function 507 that takes the parts of the switch control commands 512 and 513 and compares the sign of the switch voltage immediately before closing with the sign of the peak voltage while the switch was open. Note that in the case where the system is at resonance and a very small value is sampled it is possibly to include a dead zone in the comparison function 507 such that no change is required. In the case that the two values have the opposing signs, as illustrated by FIG. 9 it can be inferred that the tuning is set to give a resonant frequency that is below the frequency of the excitation. If the two values have the same sign as illustrated by FIG. 10, it can be inferred that the resonant frequency is set above the excitation frequency.

This sign information 515 may then be used to control an integrator 508 in either analogue or digital form and from this a tuning signal 225 is obtained that may be used to adjust the switch timing in the sense that will bring about resonance at the prevailing excitation frequency. If the excitation frequency changes from the steady state then the tuning signal will alter so as to bring the circuit back to resonance. If the response time of the integrator 508 is faster than the rate of change of the excitation frequency, then it will be possible to pass a frequency modulated (FM) signal through the system provided that the maximum deviation does not exceed the available tuning range.

FIG. 11 shows a yet further embodiment capable of self-tuning an inductor-capacitor circuit to a resonant condition. As an alternative to detecting the sign of the voltage across the switch 205 using a sample and hold function, the sign is determined using a comparator 701 and its output latched into two flip-flops 702 and 703 clocked by the switching signals 711 and 710 derived from the positive and negative 710 parts of the capacitor voltage waveform respectively. By taking the positive "Q" output 713 from the first latch 702 and the complement of the "Q" output 714 from the second latch 703 and combining these two additively 704 the correct sense of the error signal 515 is created to permit the control loop to be closed and the resonance frequency moved to match that of the excitation.

A possible problem in the implementation of such a system is the sensing of the voltage across the switch 228 with a sensitive integrated circuit such as a comparator 701 where there is a risk for an excessively large and damaging voltage appearing. FIG. 12 shows a method for attenuating the signal 228 without incurring energy losses in the circuit. Two small capacitors 731 and 732 are selected to have an appropriate attenuation ratio bearing in mind the maximum expected voltage and the limitations of the semiconductor devices in the sensing circuits. An additional switch 733 discharges the capacitors 731 and 732 to ground during the period when the main tuning switch 205 is closed. Hence the capacitive potential divider of 731 and 732 has any DC offset removed, and when at resonance, there is no energy lost through the switch 733. Clearly this method can be extended to deal with separate P FET and N FET switches. It will be obvious to one skilled in the art that there are many other possible methods of sensing the resonance condition and deriving a suitable control voltage following the general principles explained above.

In addition to providing a means for automatically tuning the LC circuit to resonance at an unknown excitation frequency within some defined range, it is also possible to use the automatic tuning system to gain knowledge of the resonance tuning characteristic via the value of the signal 225 as a function of the excitation frequency to create a look-up table in a memory holding the correct tuning voltage needed to achieve resonance with a given excitation frequency.

In prior art it is not possible to maintain resonance with a varying excitation frequency due to the bandwidth restrictions imposed by the Q factor of the inductor-capacitor (LC) network and thus frequency modulation is seldom employed except with very narrow deviation. The automatic tuning system described herein makes it possible to maintain resonance with a varying excitation frequency, provided that the automatic tuning loop has a settling time faster than the rate of change of excitation frequency. It is a further aim of some embodiments to provide means to maintain resonance during abrupt and large changes in excitation frequency thereby enabling the employment of frequency shift keying (FSK) and similar digital modulation types. With tuning information derived from the automatic tuning system during a calibration operation, it becomes possible to tune the LC network to resonate at a known frequency without the requirement that the automatic tuning feedback loop settles, and thus it is possible to maintain resonance during abrupt changes in excitation frequency.

One possible embodiment of this feature is described with reference to FIG. 13, which shows the automatic tuning means described previously incorporated herein. The excitation for the LC network (201, 203, 204) is generated by a VCO 409, and the control voltage for said VCO 408 is set by a digital input word 810 converted to analogue form by the digital to analogue converter (DAC) 804. The digital word controlling the excitation is also passed to a memory 801, in one embodiment to determine a location in the memory. The automatic tuning means 720 and 580 operates as previously described and provides a tuning signal voltage 225 via switch 806 to the capacitor switch timing 721 so as to set the LC network to resonance at the instantaneous excitation frequency. The tuning signal 225 is also passed via switch 805 to an analogue to digital converter (ADC) 802 whose digital output 811 is also passed to the memory 801 in read mode and the value stored in the location corresponding to the excitation frequency input. It will be obvious that if the excitation frequency is incremented in small steps covering the total available tuning frequency range of the network and at each time the tuning information 811 is stored, then a look up table will be created showing how the switch timing as controlled by the tuning signal voltage must be set in order to maintain resonance at any given excitation frequency.

FIG. 14 is an illustration of an example characteristic relating excitation frequency input to the appropriate tuning input represented in analogue form as the variables 408 and 225 respectively.

FIG. 15 shows the configuration of some embodiments during operation with a varying excitation frequency. Switch 806 is opened such that the automatic tuning system is no longer a closed loop. Switch 805 is operated such that the tuning control signal 225 is now generated by a DAC 803. The digital input determining the excitation frequency 810 is applied to the memory in read mode and the memory outputs the corresponding stored value of the appropriate capacitor switch timing tuning control 1011 which is passed to the DAC 803 to generate the tuning signal 225. In this way, if the excitation control input is changed to give an abrupt change in excitation frequency, the capacitor switch timing will be adjusted immediately through the tuning signal 225 to effect an immediate corresponding change and maintain resonance. FIG. 16 shows example waveforms apparent in the circuit with a nominal Q factor of 30 during an abrupt change in excitation frequency. The control for the excitation is shown in analogue form 408, and the tuning control signal 225 is also shown in analogue form. Although the excitation 411 changes by a significant factor, (33% in this example) it will be seen that the inductor current 222 shows no significant change in its magnitude indicating that resonance has been maintained and the Q factor also maintained. For comparison purposes, the inductor current is also shown on the same axes for an LC network with a fixed tuning at approximately 8% above the first frequency. This shows a lower initial current and then a large drop in current.

Although the automatic tuning loop is not active during this mode it is possible to monitor the error output 515 of the resonance detection block 507 to perform a background calibration of the tuning accuracy 1012 and provide adjustments to the information stored in the memory 801 so as to allow for environmental factors occurring after the calibration operation.

The foregoing description of the features of the invention has used a predominantly analogue implementation for ease of explanation but it will be obvious to one skilled in the art that much or all of the embodiments described may be implemented in fast digital form. For example, the integrator 508 may be replaced with a digital accumulator and a DAC allowing wide adjustment of the smoothing and settling behaviour of the automatic tuning loop, eliminating the need for an additional ADC 802 for the storage of the tuning characteristic.

The embodiments described are given to explain the function of the invention but it will be obvious to one skilled in the art that many other implementations and arrangements are possible. For example, FIG. 17 shows such an arrangement wherein the excitation 1221 and switch 1205 may be configured in such a way that the inductor 1201 can be connected to a ground node. In this case the signal 1222 required for automatic tuning 1206 may be derived by means of a differential amplifier 1202 sensing the voltage across the switch 1205. Further, it will be obvious that the embodiments may be implemented with the excitation and switching configured symmetrically or differentially or in one of a number of possible bridge arrangements. FIG. 18 shows one possible arrangement wherein the capacitance is split into several elements 1303, 1304, 1305 and 1306, and these are placed on either side of the inductor 1201 with switching 1307 and 1308 also on both sides of the inductor. The signals 1327 and 1328 needed for the automatic tuning are obtained using two differential amplifiers 1309 and 1310.

Whilst embodiments of this invention have been described with reference to particular examples these should not be interpreted as restricting the scope of the invention in any way. It is to be made clear that many other possible embodiments, modifications and improvements may be incorporated into or with the invention without departing from the scope of the invention as set out in the claims.

The invention claimed is:

1. A circuit configured to control a resonant frequency of a tuned circuit so as to correspond with an applied excitation frequency over a continuous range of excitation frequencies, the tuned circuit comprising: an inductor; at least two capacitors; and at least one switch connected in combination with one of the at least two capacitors, wherein an apparent resonant frequency can be varied by controlling the duty cycle of an opening and closing of the at least one switch; and a source providing an excitation signal to the tuned circuit, the circuit configured to control the resonant frequency comprising:

a voltage sensor configured to sense a voltage across two terminals of the at least one switch when the at least one switch is in an open state;

tuning control circuitry configured to derive a tuning control input signal from the sensed voltage; and switch timing circuitry configured to control the timing of the opening and closing of the at least one switch in a manner based on the derived tuning control input signal, wherein the opening and closing instants of the said at least one switch are synchronous with the applied excitation signal and wherein the opening and closing instants of the said at least one switch are substantially equally spaced in time around a peak of a voltage at the connection between the inductor and the capacitors when the circuit is at resonance.

2. The circuit according to claim 1, wherein the tuning control circuitry configured to derive the tuning control input signal from the sensed voltage comprises correction signal circuitry configured to derive a correction signal from the sensed voltage wherein the correction signal is configured to alter the apparent resonant frequency to correspond with the excitation frequency.

3. The circuit according to claim 1, wherein the switch timing circuitry configured to control the timing of the opening and closing of the at least one switch comprises on-off ratio circuitry configured to control a ratio of an on-to-off time of the at least one switch based on the control input signal so as to alter the apparent resonant frequency of the tuned circuit.

4. The circuit according to claim 1, further comprising comparison circuitry configured to compare the apparent resonant frequency with the frequency of the applied periodic excitation signal and for determining the sign of result of the comparison, said comparison circuitry using the voltage sensed across said at least one switch.

5. The circuit according to claim 4, wherein the tuning control circuitry configured to derive the tuning control input signal from the sensed voltage is configured to generate the tuning control input signal from the sign of the difference between the apparent resonant frequency and the excitation frequency.

6. The circuit according to claim 5 wherein the tuning control input signal is used by the switch timing circuitry configured to control the timing of the opening and closing of the at least one switch to alter the timing of the at least one switch so that the apparent resonant frequency corresponds with the excitation frequency.

7. The circuit according to claim 1 wherein the switch timing circuitry configured to control the timing of the opening and closing of the at least one switch is configured to control the timing of the opening and closing of the at least one switch such that the sensed voltage across the at least one switch is substantially zero at the instant immediately before it closes when the circuit is at resonance.

8. The circuit according to claim 7 wherein tuning control circuitry configured to derive the tuning control input signal from the sensed voltage is configured to compare the apparent resonant frequency with the frequency of the applied excitation signal and for determining the sign of result of the comparison, said tuning control circuitry using the voltage sensed across said at least one switch at an instant immediately before closing.

9. The circuit according to claim 1 wherein a configuration of the circuit's excitation sources, switches, capacitors and sensing circuitry are disposed electrically in a substantially symmetrical manner with respect to the inductor and at least one of the signals is in differential form.

10. The circuit according to claim 1 wherein the signals are substantially analogue in form.

11. The circuit according to claim 1 wherein the signals are substantially digital in form.

12. A system comprising:
a tuned circuit comprising an inductor; at least two capacitors; at least one switch connected in combination with one of the at least two capacitors wherein an apparent resonant frequency can be varied by controlling the duty cycle of the opening and closing of the at least one switch; and a source providing a periodic excitation signal to the tuned circuit; and
a tuning control circuit configured to control the resonant frequency comprising:
a voltage sensor configured to sense a voltage across the at least one switch when the at least one switch is in an open state;
tuning control circuitry configured to derive a tuning control input signal from the sensed voltage;
switch timing circuitry configured to control timing of the opening and closing of the at least one switch in a manner based on the derived tuning control input signal, wherein the opening and closing instants of the said at least one switch are synchronous with the applied excitation signal and wherein the opening and closing instants of the said at least one switch are substantially equally spaced in time around a peak of a voltage at the connection between the inductor and the capacitors when the circuit is at resonance;
monitoring circuitry configured to observe a value of the tuning control input signal at the excitation frequency;
storage circuitry configured to store the tuning control input signal value corresponding to the excitation frequency.

13. The circuit according to claim 12 wherein the variation in the frequency of the excitation signal conveys information.

14. The circuit according to claim 12 wherein the tuning control input signal value and the excitation frequency value of the correction signal are stored in locations in an electronic memory device.

15. The circuit according to claim 14 wherein the excitation frequency is varied in a number of increments over an operating frequency range of the circuit and at each frequency variation an excitation frequency control value and the tuning control input signal value are stored.

16. A system for using a stored tuning characteristic relating to a tuned circuit having a variable resonant frequency comprising:
a tuned circuit comprising an inductor; at least two capacitors; at least one switch connected in combination with one of the at least two capacitors wherein an apparent resonant frequency can be varied by controlling the duty cycle of the opening and closing of the at least one switch; and a source providing a periodic excitation signal to the tuned circuit;
a resonant frequency control circuit configured to control the resonant frequency comprising:
a voltage sensor configured to sense a voltage across the at least one switch when the at least one switch is in an open state;
tuning control circuitry configured to derive a tuning control input signal from the sensed voltage;
switch timing circuitry configured to control the timing of the opening and closing of the at least one switch in a manner based on the derived tuning control input signal, wherein the opening and closing instants of the said at least one switch are synchronous with the applied excitation signal and wherein the opening and closing instants of the said at least one switch are substantially equally spaced in time around a peak of a voltage at the connection between the inductor and the capacitors when the circuit is at resonance;
monitor circuitry configured to observe a value of the tuning control input signal at the excitation frequency;
storage circuitry configured to store the tuning control input signal value corresponding to the excitation frequency;
an electronic memory containing information relating to the tuning control input signal value for a given excitation frequency control value and;
read circuitry configured to read the information in the memory corresponding to the frequency of an applied excitation; and
setting circuitry to take the information in the memory and apply the tuning control input signal so as to set the resonant frequency of the tuned circuit.

17. The system according to claim 16, wherein the excitation frequency is varying with time and the circuit is altered using the stored information to maintain resonance.

18. The system according to claim 17 wherein the variation of the excitation frequency conveys information.

19. The system according to claim 17 wherein the excitation frequency changes in an abrupt manner.

* * * * *